(12) United States Patent
Maemura et al.

(10) Patent No.: US 7,531,864 B2
(45) Date of Patent: May 12, 2009

(54) NONVOLATILE MEMORY DEVICE

(75) Inventors: Kimihiro Maemura, Suwa-Gun Hara (JP); Satoru Kodaira, Chino (JP); Hitoshi Kobayashi, Suwa (JP)

(73) Assignee: Seiko Epson Corporation, Tokyo (JP)

(*) Notice: Subject to any disclaimer, the term of this patent is extended or adjusted under 35 U.S.C. 154(b) by 253 days.

(21) Appl. No.: 11/148,302

(22) Filed: Jun. 9, 2005

(65) Prior Publication Data
US 2005/0275009 A1 Dec. 15, 2005

(30) Foreign Application Priority Data
Jun. 14, 2004 (JP) .............................. 2004-175556

(51) Int. Cl.
*H01L 29/76* (2006.01)
(52) U.S. Cl. ................... 257/314; 257/318; 257/E29.3; 257/E29.304
(58) Field of Classification Search ................. 257/318, 257/320, 314, 322, 316, E29.3, E29.301, 257/E29.302, E29.304–E29.307; 365/185.1, 365/185.26
See application file for complete search history.

(56) References Cited

U.S. PATENT DOCUMENTS

| 4,935,790 | A | | 6/1990 | Cappelletti et al. |
| 5,404,328 | A | | 4/1995 | Takemae |
| 5,465,231 | A | | 11/1995 | Ohsaki |
| 5,596,524 | A | * | 1/1997 | Lin et al. ................. 365/185.1 |
| 5,892,709 | A | | 4/1999 | Parris et al. |
| 6,028,789 | A | * | 2/2000 | Mehta et al. ............ 365/185.14 |
| 6,404,006 | B2 | * | 6/2002 | Li et al. ....................... 257/321 |
| 6,731,541 | B2 | * | 5/2004 | Kinsey et al. .......... 365/185.18 |
| 6,995,436 | B2 | | 2/2006 | Kawasaki |

FOREIGN PATENT DOCUMENTS

| JP | A 62-200769 | 9/1987 |
| JP | A-63-166274 | 7/1988 |
| JP | A 03-179780 | 8/1991 |
| JP | A 06-334190 | 12/1994 |
| JP | A 10-335505 | 12/1998 |
| JP | A 2004-363260 | 12/2004 |

OTHER PUBLICATIONS

U.S. Appl. No. 11/223,679, filed Sep. 9, 2005.

* cited by examiner

*Primary Examiner*—Eugene Lee
(74) *Attorney, Agent, or Firm*—Oliff & Berridge, PLC

(57) ABSTRACT

A nonvolatile memory device includes: a semiconductor layer of a first conductivity type in which a first region, a second region, and a third region are partitioned by an isolation insulating layer; a semiconductor section of a second conductivity type provided in the first region and functioning as a control gate; a semiconductor section of the first conductivity type provided in the second region; a semiconductor section of the second conductivity type provided in the third region; an insulating layer provided on the semiconductor layer in the first to third regions; a floating gate electrode provided on the insulating layer across the first to third regions; impurity regions of the first conductivity type provided on each side of the floating gate electrode in the first region; impurity regions of the second conductivity type provided on each side of the floating gate electrode in the second region and functioning as either a source region or a drain region; and impurity regions of the first conductivity type provided on each side of the floating gate electrode in the third region and functioning as either a source region or a drain region.

8 Claims, 6 Drawing Sheets

US 7,531,864 B2

NONVOLATILE MEMORY DEVICE

Japanese Patent Application No. 2004-175556, filed on Jun. 14, 2004, is hereby incorporated by reference in its entirety.

BACKGROUND OF THE INVENTION

The present invention relates to a nonvolatile semiconductor memory device including a floating gate. More particularly, the invention relates to a nonvolatile memory device which can be manufactured by simple manufacturing steps.

As one type of a nonvolatile memory device, a stacked-gate nonvolatile memory device including a floating gate electrode provided on a semiconductor layer through an insulating layer, a control gate electrode provided on the floating gate electrode through an insulating layer, and a source region and a drain region provided in the semiconductor layer can be given. In such a stacked-gate nonvolatile memory device, writing and erasing are performed by applying a predetermined voltage to the control gate electrode and the drain region to cause injection or discharging of electrons into or from the floating gate electrode.

However, since the stacked-gate nonvolatile memory device involves gate electrode formation steps twice, the number of steps is increased. Moreover, since it is necessary to form a thin insulating layer on the floating gate electrode, the manufacturing steps become complicated.

As a nonvolatile memory device which can be manufactured at low cost using simple manufacturing steps in comparison with the stacked-gate nonvolatile memory device, a nonvolatile memory device disclosed in Japanese Patent Application Laid-open No. 63-166274 has been proposed. In the nonvolatile memory device disclosed in Japanese Patent Application Laid-open No. 63-166274, a control gate is formed by an N-type impurity region in a semiconductor layer, and a floating gate electrode is formed by a single-layer conductive layer such as a polysilicon layer (hereinafter may be called "single-layer-gate nonvolatile memory device"). Such a single-layer-gate nonvolatile memory device can be manufactured in the same manner as in a CMOS transistor process, since it is unnecessary to stack gate electrodes.

SUMMARY

A nonvolatile memory device according to a first aspect of the invention comprises:

a semiconductor layer of a first conductivity type in which a first region, a second region, and a third region are partitioned by an isolation insulating layer;

a semiconductor section of a second conductivity type provided in the first region and functioning as a control gate;

a semiconductor section of the first conductivity type provided in the second region;

a semiconductor section of the second conductivity type provided in the third region;

an insulating layer provided on the semiconductor layer in the first to third regions;

a floating gate electrode provided on the insulating layer across the first to third regions;

impurity regions of the first conductivity type provided on each side of the floating gate electrode in the first region;

impurity regions of the second conductivity type provided on each side of the floating gate electrode in the second region and functioning as either a source region or a drain region; and impurity regions of the first conductivity type provided on each side of the floating gate electrode in the third region and functioning as either a source region or a drain region.

A nonvolatile memory device according to a second aspect of the invention comprises:

a semiconductor layer of a first conductivity type in which a first region, a second region, and a third region are partitioned by an isolation insulating layer;

a semiconductor section of the first conductivity type provided in the semiconductor layer to enclose the first region and the second region;

a semiconductor section of a second conductivity type provided in the semiconductor layer in the third region;

an insulating layer provided on the semiconductor layer in the first to third regions;

a floating gate electrode provided on the insulating layer across the first to third regions;

a first impurity region of the second conductivity type provided in the semiconductor layer under the floating gate electrode in the first region and functioning as a control gate;

second impurity regions of the second conductivity type provided on each side of the floating gate electrode in the second region and functioning as either a source region or a drain region; and third impurity regions of the first conductivity type provided on each side of the floating gate electrode in the third region and functioning as either a source region or a drain region.

DETAILED DESCRIPTION OF THE EMBODIMENT

Figure 1:
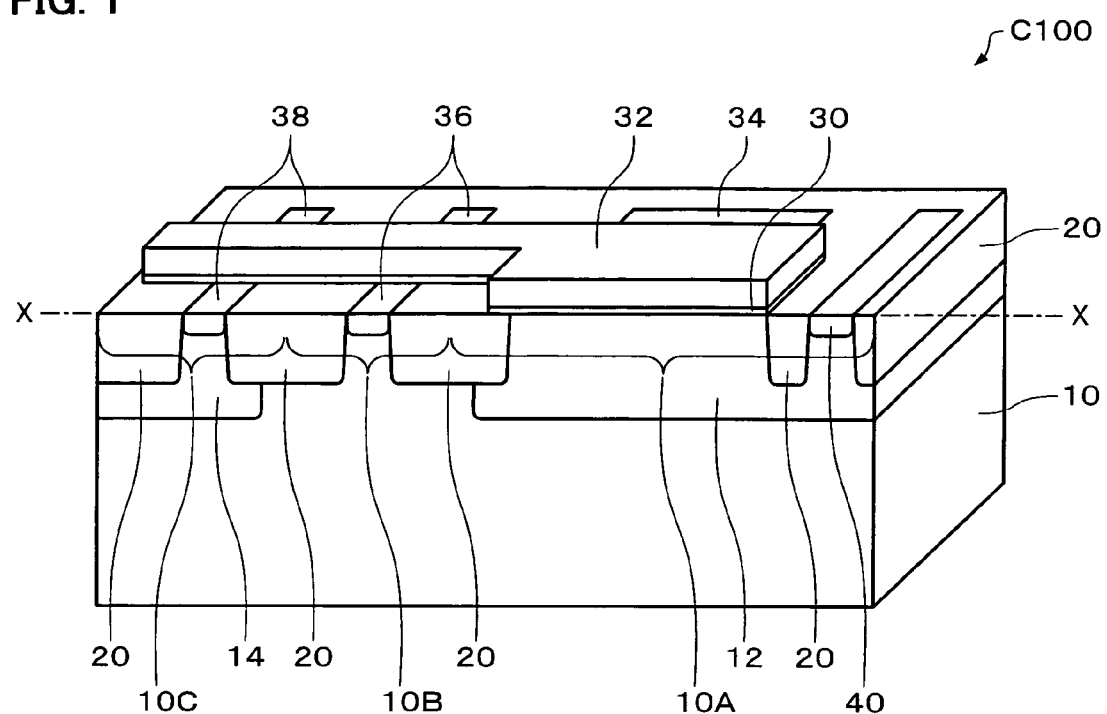
FIG. 1 is a perspective view schematically showing a nonvolatile memory device according to a first embodiment.

The invention relates to a single-layer-gate nonvolatile memory device, and may provide a nonvolatile memory device excelling in operation characteristics such as writing and erasing.

A nonvolatile memory device according to an embodiment of the invention comprises:

a semiconductor layer of a first conductivity type in which a first region, a second region, and a third region are partitioned by an isolation insulating layer;

a semiconductor section of a second conductivity type provided in the first region and functioning as a control gate;

a semiconductor section of the first conductivity type provided in the second region;

a semiconductor section of the second conductivity type provided in the third region;

an insulating layer provided on the semiconductor layer in the first to third regions;

a floating gate electrode provided on the insulating layer across the first to third regions;

impurity regions of the first conductivity type provided on each side of the floating gate electrode in the first region;

impurity regions of the second conductivity type provided on each side of the floating gate electrode in the second region and functioning as either a source region or a drain region; and impurity regions of the first conductivity type provided on each side of the floating gate electrode in the third region and functioning as either a source region or a drain region.

The nonvolatile memory device of this embodiment is a single-layer-gate nonvolatile memory device, in which the semiconductor section of the second conductivity type provided in the semiconductor layer in the first region functions as the control gate, and the floating gate electrode is provided over the first to third regions. A MOS transistor of which the gate electrode is the floating gate electrode provided on the semiconductor layer in the second region functions as a write section, and a MOS transistor of which the gate electrode is the floating gate electrode provided on the semiconductor layer in the third region functions as an erase section. Specifically, the single-layer-gate nonvolatile memory device of this embodiment has a configuration in which writing and erasing are performed by using the MOS transistors having different channel conductivity types. The advantage achieved by performing writing and erasing by using the different MOS transistors is described below. Erasing is performed by applying a voltage to the section with a small capacitive coupling and setting the section with a large capacitive coupling at 0 V to remove electrons injected into the floating gate electrode using an FN tunnel current. As a single-layer-gate nonvolatile memory device given as a related-art example, a nonvolatile memory device of the type in which writing and erasing are performed by a single MOS transistor (single section) can be given. The single-layer-gate nonvolatile memory device is designed so that the capacitance of the write region is decreased since it is necessary to increase the ratio of the capacitance between the control gate and the floating gate electrode in comparison with the capacitance of the write region. Specifically, it is necessary to apply a high erase voltage to the section with a small capacitive coupling during erasing.

However, a breakdown voltage sufficient for the voltage applied during erasing cannot be secured in a minute nonvolatile memory device, whereby the MOS transistor may be destroyed. Therefore, in the nonvolatile memory device of this embodiment, writing and erasing are performed by using different MOS transistors, and the MOS transistors have different channel conductivity types. In the case where a P-channel MOS transistor is formed as the MOS transistor for erasing, the MOS transistor for erasing is formed on the N-type well. Therefore, a voltage up to the junction breakdown voltage between the well and the substrate (semiconductor layer) can be applied during erasing. As a result, the breakdown voltage for the erase voltage can be increased in comparison with the case of erasing at a section the same as the write region, whereby a minute nonvolatile memory device with improved reliability can be provided.

In the nonvolatile memory device of this embodiment, the impurity regions of the first conductivity type are provided on each side of the floating gate electrode in the first region in which the control gate is provided. Specifically, the MOS transistor with a channel of the first conductivity type including the insulating layer, the floating gate electrode, and the impurity regions is provided on the N-type well (control gate). In the nonvolatile memory device of this embodiment, a voltage corresponding to the capacitance ratio can be applied to the floating gate electrode by applying a voltage to the control gate. A channel of the MOS transistor is induced when a voltage is applied to the control gate, whereby depletion of the control gate can be prevented. This enables the capacitive coupling to be increased, whereby the write speed can be increased. As a result, a nonvolatile memory device with improved operation characteristics can be provided.

With this nonvolatile memory device, the semiconductor sections of the second conductivity type may be N-type wells.

With this nonvolatile memory device, a ratio of a total overlapping area of the floating gate electrode and the semiconductor layer in the first to third regions to an overlapping area of the semiconductor section and the floating gate electrode in the first region may be 10:6 to 10:9.

A nonvolatile memory device according to another embodiment of the invention comprises:

a semiconductor layer of a first conductivity type in which a first region, a second region, and a third region are partitioned by an isolation insulating layer;

a semiconductor section of the first conductivity type provided in the semiconductor layer to enclose the first region and the second region;

a semiconductor section of a second conductivity type provided in the semiconductor layer in the third region;

an insulating layer provided on the semiconductor layer in the first to third regions;

a floating gate electrode provided on the insulating layer across the first to third regions;

a first impurity region of the second conductivity type provided in the semiconductor layer under the floating gate electrode in the first region and functioning as a control gate;

second impurity regions of the second conductivity type provided on each side of the floating gate electrode in the second region and functioning as either a source region or a drain region; and third impurity regions of the first conductivity type provided on each side of the floating gate electrode in the third region and functioning as either a source region or a drain region.

According to the second nonvolatile memory device of this embodiment, a single-layer-gate nonvolatile memory device having a novel structure can be provided in the same manner as the first nonvolatile memory device. In the second nonvolatile memory device, the first impurity region of the second conductivity type provided under the floating gate electrode in the first region functions as the control gate. Therefore, a minute nonvolatile memory device can be provided in comparison with the first nonvolatile memory device in which the entire well functions as the control gate.

This nonvolatile memory device may further comprise fourth impurity regions having an impurity concentration higher than an impurity concentration of the first impurity region and provided on each side of the floating gate electrode in the first region.

With this nonvolatile memory device, a ratio of a total overlapping area of the floating gate electrode and the semiconductor layer in the first to third regions to an overlapping area of the first impurity region and the floating gate electrode in the first region may be 10:6 to 10:9.

First Embodiment

Figure 2:
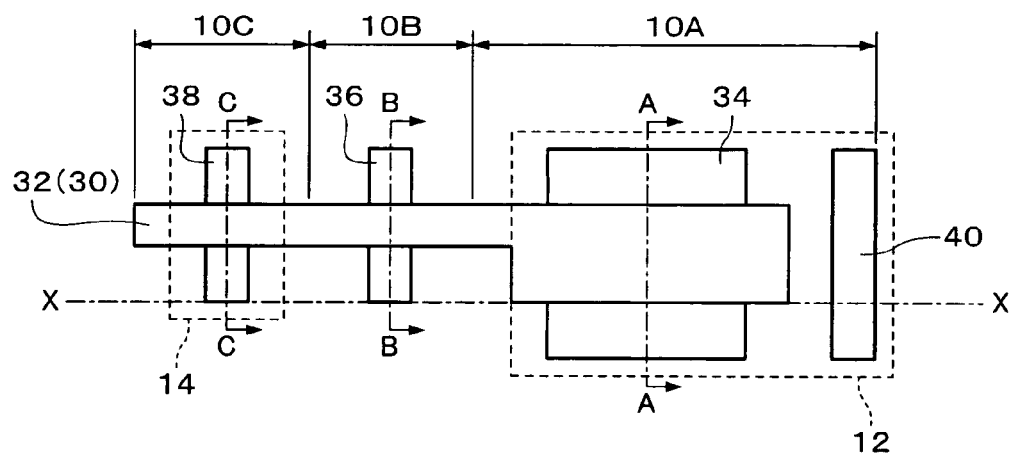
FIG. 2 is a plan view schematically showing the nonvolatile memory device according to the first embodiment.
Figure 3A:
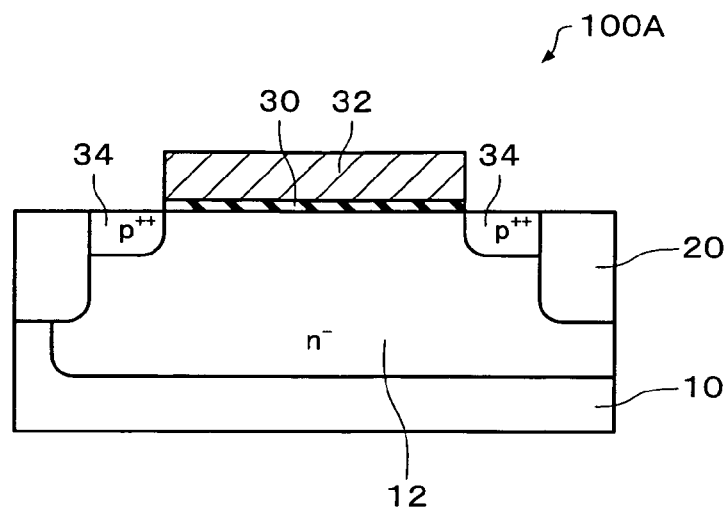
FIG. 3A is a cross-sectional view along the line A-A shown in FIG. 2.
Figure 3B:
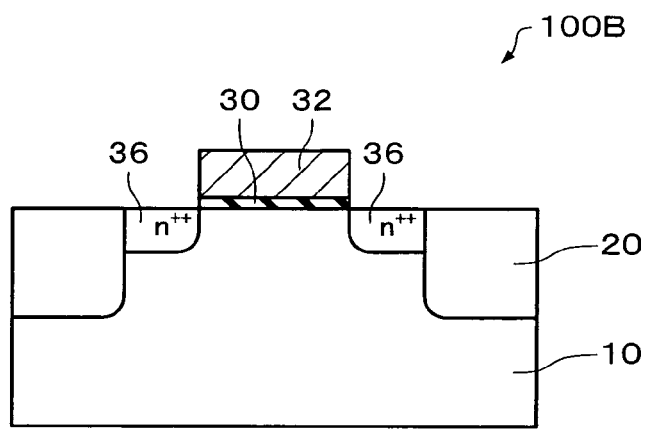
FIG. 3B is a cross-sectional view along the line B-B shown in FIG. 2.
Figure 3C:
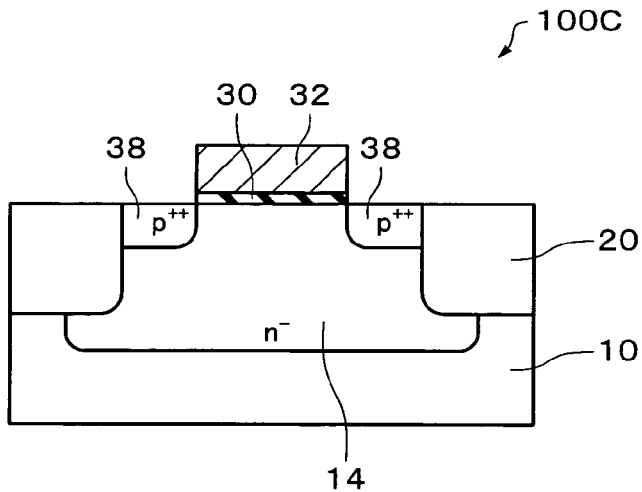
FIG. 3C is a cross-sectional view along the line C-C shown in FIG. 2.

A nonvolatile memory device according to a first embodiment is described below with reference to FIGS. 1 to 3C. FIG. 1 is a perspective view showing a memory cell C100 which is the nonvolatile memory device of this embodiment, FIG. 2 is a plan view showing a floating gate electrode 32 of the memory cell C100 and the arrangement of impurity regions, and FIG. 3A is a cross-sectional view along the line A-A shown in FIG. 2. FIG. 3B is a cross-sectional view along the line B-B shown in FIG. 2. FIG. 3C is a cross-sectional view along the line C-C shown in FIG. 2. The line X-X shown in FIG. 1 corresponds to the line X-X shown in FIG. 2.

As shown in FIG. 1, the memory cell C100 according to this embodiment is provided on a P-type semiconductor layer 10. In the semiconductor layer 10, a first region 10A, a second region 10B, and a third region 10C are partitioned by an isolation insulating layer 20. N-type wells 12 and 14 are respectively provided in the first region 10A and the third region 10C. The N-type well 12 in the first region 10A functions as a control gate of the memory cell C100. The second region 10B is a write section for injecting electrons into a floating gate electrode 32 described later. The third region 10C is an erase section for discharging electrons injected into the floating gate electrode 32. The cross-sectional structure of each region is described later.

An insulating layer 30 is provided on the semiconductor layer 10 in the first to third regions 10A to 10C. The floating gate electrode 32 is provided on the insulating layer 30 across the first to third regions 10A to 10C. In the first region 10A, an N-type impurity region 40 is provided in the region isolated by the isolation insulating layer 20 from the region in which the floating gate electrode 32 is provided. The N-type impurity region 40 is a contact region for applying a voltage to the N-type well 12 as the control gate during writing.

In the first region 10A, as shown in FIGS. 1 and 2, P-type impurity regions 34 are provided on each side of the floating gate electrode 32. In the second region 10B, N-type impurity regions 36 are provided on each side of the floating gate electrode 32. In the third region 10C, P-type impurity regions 38 are provided on each side of the floating gate electrode 32.

The cross-sectional structure of each region is described below.

As shown in FIG. 3A, a P-channel transistor 100A is provided in the first region 10A. The P-channel transistor 100A includes the insulating layer 30 provided on the N-type well 12, the floating gate electrode 32 provided on the insulating layer 30, and the impurity regions 34 provided in the N-type well 12. The impurity region 34 is either a source region or a drain region. An advantage achieved by providing the P-channel transistor 100A on the N-type well 12 which functions as the control gate is described later when describing the effect of this embodiment.

As shown in FIG. 3B, an N-channel MOS transistor 100B for writing into the memory cell C100 is provided in the second region 10B. The N-channel transistor 100B includes the insulating layer 30 provided on the P-type semiconductor layer 10, the floating gate electrode 32 provided on the insulating layer 30, and the impurity regions 36 provided in the P-type semiconductor layer 10. The impurity region 36 is either a source region or a drain region.

As shown in FIG. 3C, a P-channel transistor 100C is provided in the third region 10C. The P-channel transistor 100C includes the insulating layer 30 provided on the N-type well 14, the floating gate electrode 32 provided on the insulating layer 30, and the impurity regions 38 provided in the N-type well 14. The impurity region 38 is either a source region or a drain region.

The positional relationship between the floating gate electrode 32 and the N-type well 12 and the impurity regions 34, 36, and 38 is described below with reference to FIG. 2. In the nonvolatile memory device according to this embodiment, a voltage corresponding to the ratio of the capacitance between the floating gate electrode 32 and the N-type well 12 in the first region 10A to the capacitance between the floating gate electrode 32 and the P-type semiconductor layer 10 in the second region 10B is applied to the floating gate electrode 32. Specifically, a voltage with a value obtained by multiplying the voltage applied to the control gate by the capacitance ratio is applied to the floating gate electrode 32. Therefore, in order to enable efficient writing, it is preferable that the overlapping area of the floating gate electrode 32 and the N-type well 12 as the control gate be larger than the overlapping area of the semiconductor layer 10 and the floating gate electrode 32 in the second region 10B for writing. In the nonvolatile memory device of this embodiment, the area is determined as described below.

The overlapping area of the floating gate electrode 32 and the N-type well 12 as the control gate in the first region 10A is referred to as a first area. The total overlapping area of the floating gate electrode 32 and the P-type semiconductor layer 10 in the first to third regions 10A to 10C is referred to as a second area. In the nonvolatile memory device of this embodiment, the area ratio (first area/second area) may be set at 0.6 to 0.9 in order to secure a predetermined capacitance ratio. This is because the write/erase efficiency significantly deteriorates when the area ratio is smaller than 0.6 and the area of the control gate is significantly increased when the area ratio exceeds 0.9.

The nonvolatile memory device of this embodiment is a single-layer-gate nonvolatile memory device, in which the N-type well 12, which is a semiconductor section of a second conductivity type provided in the semiconductor layer 10 in the first region 10A, functions as the control gate, and the floating gate electrode 32 is provided over the first to third regions 10A to 10C. The MOS transistor 100B of which the gate electrode is the floating gate electrode 32 provided on the semiconductor layer 10 in the second region 10B functions as the write section, and the MOS transistor 100C of which the gate electrode is the floating gate electrode 32 provided on the semiconductor layer 10 in the third region 10C functions as the erase section. Specifically, the single-layer-gate nonvolatile memory device according to this embodiment has a configuration in which writing and erasing are respectively performed by using the MOS transistors 100B and 100C having different channel conductivity types. The advantage achieved by performing writing and erasing by using the different MOS transistors 100B and 100C is described below. Erasing is performed by applying a voltage to the section with a small capacitive coupling and setting the section with a large capacitive coupling at 0 V to remove electrons injected into the floating gate electrode 32 using an FN tunnel current. As a single-layer-gate nonvolatile memory device given as a related-art example, a nonvolatile memory device of the type in which writing and erasing are performed by using a single MOS transistor (single section) can be given. The single-layer-gate nonvolatile memory device is designed so that the capacitance of the write region is decreased since it is necessary to increase the ratio of the capacitance between the control gate and the floating gate electrode to the capacitance of the write region. Specifically, in the single-layer-gate nonvolatile memory device having a configuration in which writing and erasing are performed at a single section, it is necessary to apply a high erase voltage to the section with a small capacitive coupling during erasing.

However, in a minute nonvolatile memory device, a sufficient breakdown voltage cannot be secured for the voltage applied during erasing, whereby the MOS transistor may be destroyed. Therefore, in the nonvolatile memory device of this embodiment, writing and erasing are performed by using the different MOS transistors 100B and 100C, and the MOS transistors 100B and 100C have different channel conductivity types. The P-channel MOS transistor 100C is provided as the MOS transistor 100C for erasing. The MOS transistor 100C is formed on the N-type well 14. Therefore, a voltage up to the junction breakdown voltage between the N-type well 14 and the semiconductor layer 10 can be applied during erasing. As a result, the breakdown voltage for the erase voltage can be increased in comparison with the case of erasing at a section the same as the write region, whereby a nonvolatile memory device with improved reliability can be provided.

In the nonvolatile memory device of this embodiment, the P-type impurity regions 34 are provided on each side of the floating gate electrode 32 in the first region 10A in which the control gate is provided. Specifically, the P-channel MOS transistor 100A including the insulating layer 30, the floating gate electrode 32, and the impurity regions 34 is provided on the N-type well (control gate) 12. In the nonvolatile memory device of this embodiment, a voltage corresponding to the capacitance ratio can be applied to the floating gate electrode 32 by applying a voltage to the control gate 12. A channel of the MOS transistor 100A is induced when a voltage is applied to the N-type well 12, whereby depletion of the control gate can be prevented. This enables the capacitive coupling to be increased, whereby the write speed can be increased.

As another advantage achieved by providing the impurity regions 34 on each side of the floating gate electrode 32 in the first region 10A, the following advantage can be given. In the single-layer-gate nonvolatile memory device of this embodiment, channel hot electrons (CHE) are injected into the floating gate electrode 32 by applying a voltage corresponding to the capacitance ratio to the MOS transistor 100B in the second region 10B to effect writing. Therefore, it is preferable that the nonvolatile memory device have a configuration which enables a higher capacitance ratio to be obtained. In order to achieve such a configuration, it is preferable that the ratio of the overlapping area of the N-type well 12 and the floating gate electrode 32 in the first region 10A to the overlapping area of the floating gate electrode 32 and the semiconductor layer 10 in the second region 10B be a desired ratio. However, in the case where mask misalignment occurs during patterning of the floating gate electrode 32, a part of the floating gate electrode 32 may be positioned on the isolation insulating layer 20. In this case, the overlapping area of the floating gate electrode 32 and the N-type well 12 becomes smaller than the desired area. However, according to the nonvolatile memory device of this embodiment, a decrease in the overlapping area due to misalignment can be reduced by the presence of a margin for the width of the impurity region 34, whereby a desired capacitance ratio can be achieved. In a minute device, it may be difficult to prevent misalignment. However, a desired overlapping area can be secured by the presence of the impurity regions 34 positioned on each side of the floating gate electrode 32.

Second Embodiment

Figure 4:
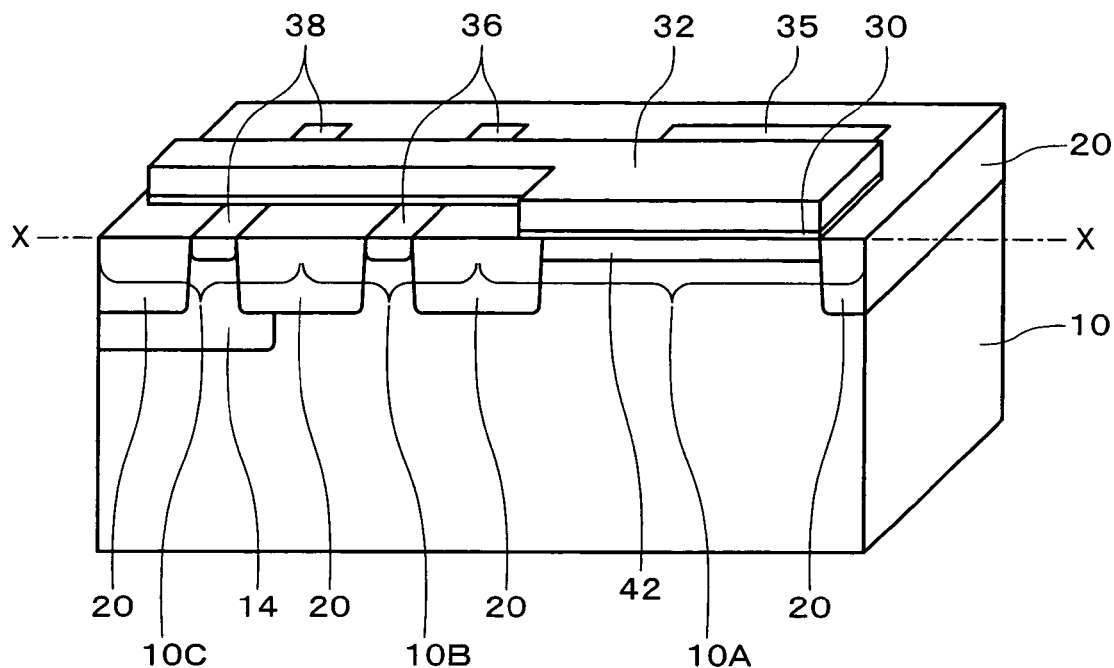
FIG. 4 is a perspective view schematically showing a nonvolatile memory device according to a second embodiment.
Figure 5:
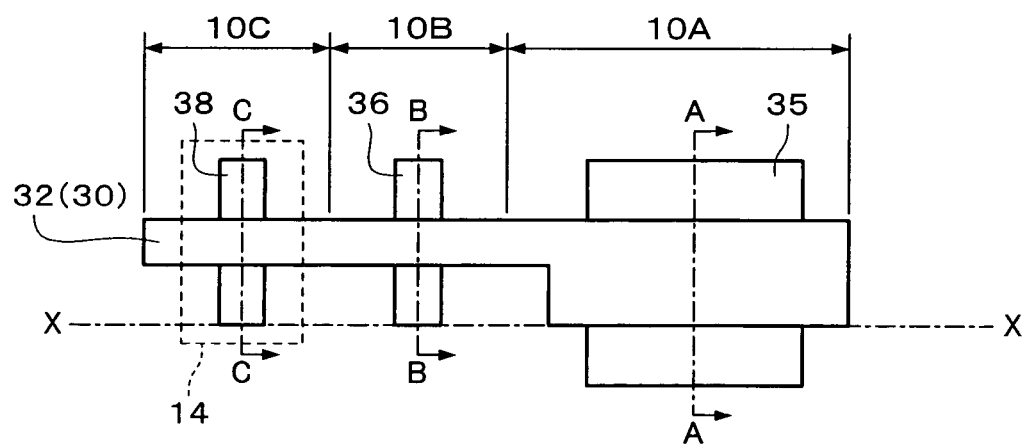
FIG. 5 is a plan view schematically showing the nonvolatile memory device according to the second embodiment.
Figure 6A:
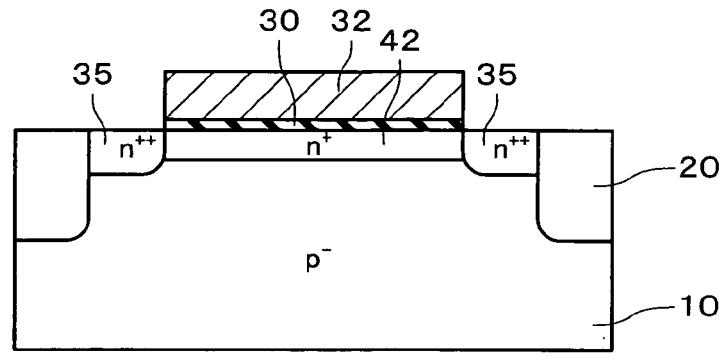
FIG. 6A is a cross-sectional view along the line A-A shown in FIG. 5.
Figure 6B:
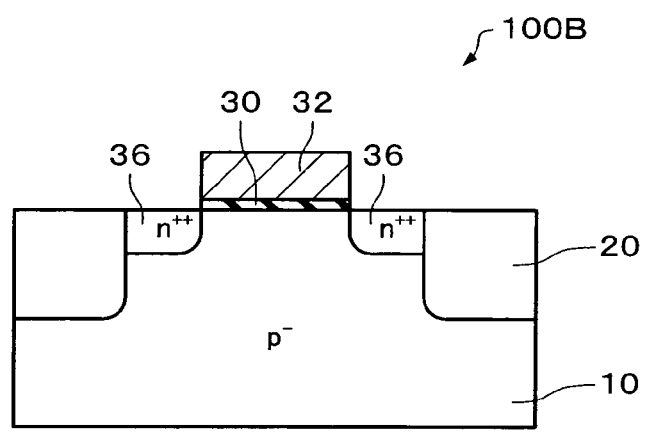
FIG. 6B is a cross-sectional view along the line B-B shown in FIG. 5.
Figure 6C:
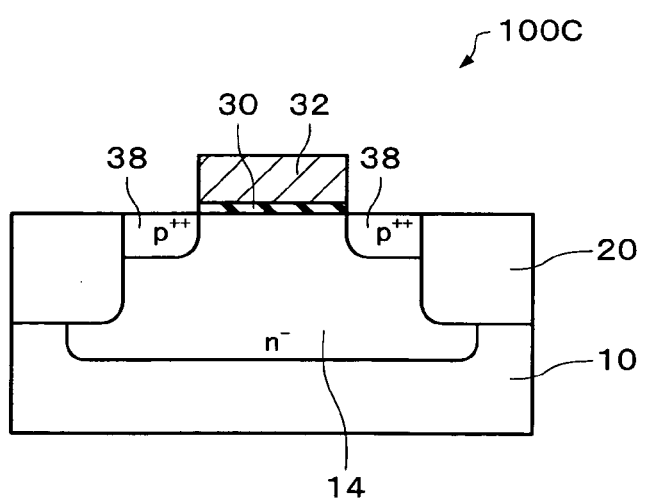
FIG. 6C is a cross-sectional view along the line C-C shown in FIG. 5.

A nonvolatile memory device according to a second embodiment is described below with reference to FIGS. 4 to 6C. The nonvolatile memory device of the second embodiment is an example which differs from the first embodiment as to the structure of the control gate section. The nonvolatile memory device according to the second embodiment differs from the first embodiment in that an N-type impurity region provided under the floating gate electrode is used as the control gate. FIG. 4 is a perspective view showing the memory cell C100 which is the nonvolatile memory device of this embodiment, FIG. 5 is a plan view showing the floating gate electrode 32 of the memory cell C100 and the arrangement of the impurity regions 35, 36, and 38, and FIG. 6A is a cross-sectional view along the line A-A shown in FIG. 5. FIG. 6B is a cross-sectional view along the line B-B shown in FIG. 5. FIG. 6C is a cross-sectional view along the line C-C shown in FIG. 5. The detailed description of the structure and the section the same as those in the first embodiment is omitted.

As shown in FIG. 4, the nonvolatile memory device of the second embodiment is provided on the P-type semiconductor layer 10 in the same manner as the nonvolatile memory device according to the first embodiment. In the semiconductor layer 10, the first region 10A, the second region 10B, and the third region 10C are partitioned by the isolation insulating layer 20. The first region 10A and the second region 10B are provided in the P-type semiconductor layer 10. The third region 10C is provided in the N-type well 14. As described in the first embodiment, the first region 10A is the control gate section, the second region 10B is the write section, and the third region 10C is the erase section.

As shown in FIG. 4, the insulating layer 30 is provided on the semiconductor layer 10 in the first to third regions 10A to 10C. The floating gate electrode 32 is provided on the insulating layer 30 across the first to third regions 10A to 10C. In the first region 10A, as shown in FIGS. 4 and 5, N-type impurity regions 35 are provided on each side of the floating gate electrode 32. In the second region 10B, the N-type impurity regions 36 are provided on each side of the floating gate electrode 32. In the third region 10C, the P-type impurity regions 38 are provided on each side of the floating gate electrode 32.

The cross-sectional structure of each region is described below with reference to FIGS. 6A to 6C.

As shown in FIG. 6A, the insulating layer 30 provided on the P-type semiconductor layer 10, the floating gate electrode 32 provided on the insulating layer 30, an N-type impurity region 42 provided in the semiconductor 10 under the floating gate electrode 32, and the N-type impurity regions 35 provided adjacent to the impurity region 42 are provided in the first region 10A. The N-type impurity region 42 functions as the control gate, and the impurity region 35 is a contact section which is electrically connected with a control gate line and applies a voltage to the control gate.

As shown in FIG. 6B, the N-channel transistor 100B for writing is provided in the second region 10B. The N-channel transistor 100B includes the insulating layer 30 provided on the P-type semiconductor layer 10, the floating gate electrode 32 provided on the insulating layer 30, and the impurity regions 36 provided in the P-type semiconductor layer 10. The impurity region 36 is either a source region or a drain region.

As shown in FIG. 6C, the P-channel transistor 100C is provided in the third region 10C. The P-channel transistor 100C includes the insulating layer 30 provided on the N-type well 14, the floating gate electrode 34 provided on the insulating layer 30, and the impurity regions 38 provided in the N-type well 14. The impurity region 38 is either a source region or a drain region.

In the nonvolatile memory device of the second embodiment, it is preferable that the ratio of the overlapping area (first area) of the floating gate electrode 32 and the impurity region 42 to the total overlapping area (second area) of the floating gate electrode 32 and the semiconductor layer 10 in the first to third regions 10A to 10C be 6:10 to 9:10. If the ratio of the first area to the second area is within the above range, a nonvolatile memory device with a desired capacitance ratio can be provided.

According to the second nonvolatile memory device of this embodiment, a single-layer-gate nonvolatile memory device having an advantage the same as that of the first nonvolatile memory device and exhibiting improved operation characteristics can be provided. In the second nonvolatile memory device, the N-type first impurity region 42 under the floating gate electrode 32 in the first region 10A functions as the control gate. Therefore, a minute nonvolatile memory device can be provided in comparison with the first nonvolatile memory device in which the entire N-type well 12 functions as the control gate.

In the first region 10A, the N-type impurity regions 35 are provided on each side of the floating gate electrode 32. Therefore, a decrease in the capacitance due to mask misalignment during formation of the floating gate electrode 32 can be prevented in the same manner as in the first embodiment. As a result, a nonvolatile memory device having excellent characteristics can be provided.

Figure 7:
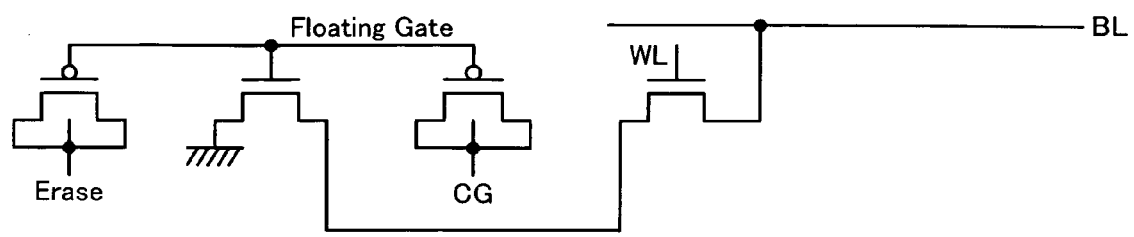
FIG. 7 shows an equivalent circuit of the nonvolatile memory device shown in FIGS. 1 and 4.

The operation method for the nonvolatile memory devices according to the first and second embodiments is described below. FIG. 7 shows an equivalent circuit of the nonvolatile memory devices according to the first and second embodiments. Although not shown in FIGS. 1 to 3C and 4 to 6C, a select transistor is provided in the nonvolatile memory of this embodiment. As shown in FIG. 7, a gate electrode of the select transistor is electrically connected with a wordline, and a drain region is electrically connected with a bitline. A source region is electrically connected with the drain region 36 of the MOS transistor 100B in the write region. The source region of the transistor in the write region is connected with a ground line.

The write operation is described below. The write operation is performed by injecting channel hot electrons (CHE) into the floating gate electrode 32 of the N-channel transistor in the second region 10B. A voltage of 8 V is applied to the N-type well 12 as the control gate, and a voltage of 8 V is applied to the drain region of the MOS transistor 100B in the second region through the select transistor. A voltage of about 7.2 V can be applied to the floating gate electrode 32 by applying a voltage of 8 V to the N-type well 12. This enables hot electrons to be generated near the drain region 36 of the MOS transistor 100B in the second region 10B. The hot electrons are injected into the floating gate electrode 32, whereby the write operation is performed.

The read operation is described below. The read operation utilizes a phenomenon in which the threshold of the MOS transistor 100B is changed in the nonvolatile memory device in which electrons are injected into the floating gate electrode 32 (subjected to writing). For example, the read operation is performed by applying a predetermined voltage to the N-type well 12 as the control gate and the drain region 36 of the MOS transistor 100B, and sensing whether or not a current flows through the MOS transistor 100B or an increase or decrease in the voltage.

The erase operation is described below. A voltage of 18 V is applied to the drain region 38 of the MOS transistor 100C for erasing in a state in which the N-type well 12 as the control gate is grounded, whereby electrons can be removed from the floating gate electrode 32 using an FN tunnel current.

A method of manufacturing the above-described nonvolatile memory device is described below. In the following description of the manufacturing method, the manufacturing method for the nonvolatile memory device according to the first embodiment is described first, and the difference between the manufacturing method for the nonvolatile memory device according to the first embodiment and the manufacturing method for the nonvolatile memory device according to the second embodiment is described thereafter.

Figure 8:
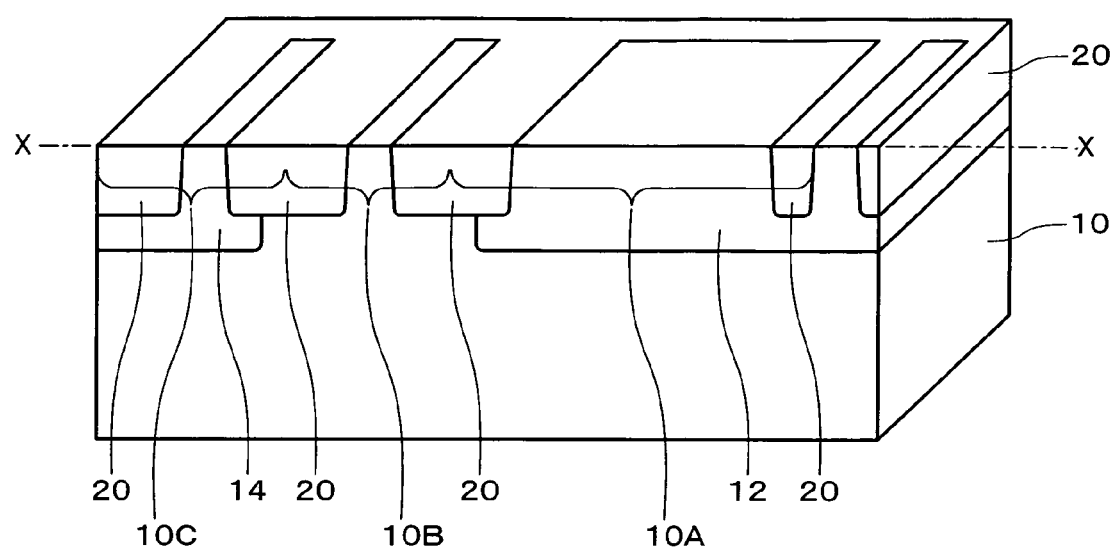
FIG. 8 shows manufacturing steps of the nonvolatile memory device shown in FIGS. 1 and 4.

As shown in FIG. 8, the isolation insulating layer 20 is formed in a predetermined region of the semiconductor layer 10. In the semiconductor device of this embodiment, the P-type semiconductor layer 10 is used. The isolation insulating layer 20 is formed by using a known local-oxidation-of-silicon (LOCOS) method or shallow trench isolation (STI) method. FIG. 8 shows the case where the isolation insulating layer 20 is formed by using the STI method. The first region 10A, the second region 10B, and the third region 10C are separated by the isolation insulating layer 20. A select transistor formation region is also partitioned by this step, although not shown in FIG. 8.

As shown in FIG. 8, the N-type well 12 is formed in the first region 10A, and the N-type well 14 is formed in the third region 10C. The N-type wells 12 and 14 are formed by providing a mask layer (not shown) which covers the region excluding the first region 10A and the third region 10C, and implanting N-type impurities. The N-type well 12 formed in the first region 10A functions as the control gate. A P-type well (not shown) may be formed in the second region, if necessary. In the case of forming the P-type well, the P-type and the N-type wells 12 and 14 may be formed in an arbitrary order.

Figure 9:
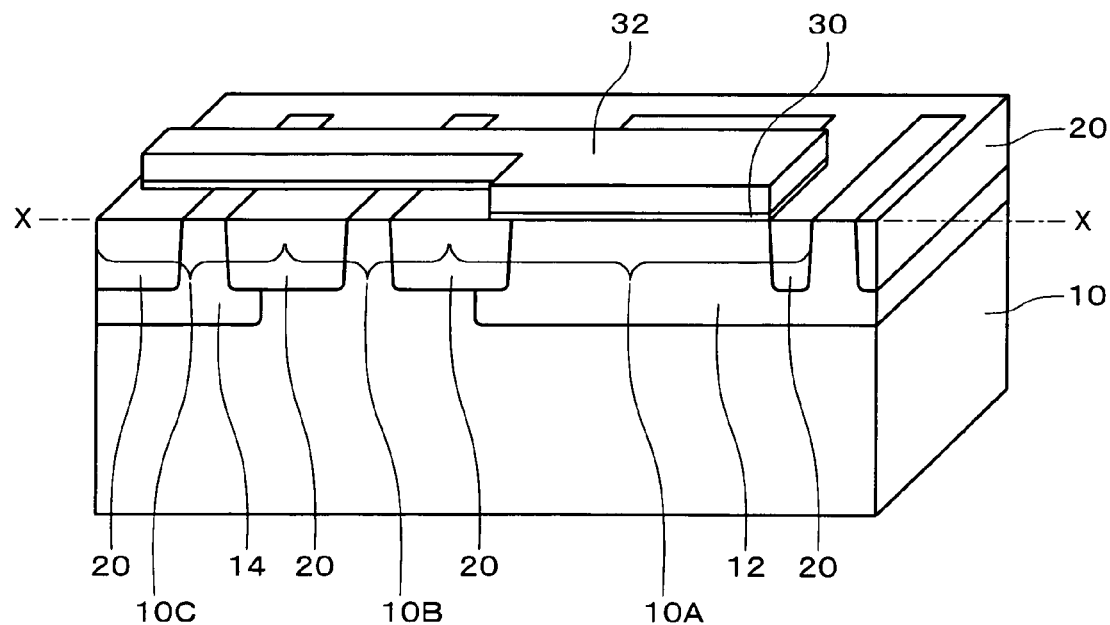
FIG. 9 shows manufacturing steps of the nonvolatile memory device shown in FIGS. 1 and 4.

As shown in FIG. 9, the insulating layer 30 is formed on the semiconductor layer 10 in the first region 10A, the second region 10B, and the third region 10C. The insulating layer 30 may be formed by using a thermal oxidation method, for example.

As shown in FIG. 9, the floating gate electrode 32 is formed on the insulating layer 30. The floating gate electrode 32 is formed by providing a conductive layer (not shown) made of a polysilicon layer on the semiconductor layer 10, and patterning the conductive layer, for example. In this case, the floating gate electrode 32 is formed so that the ratio of the overlapping area of the floating gate electrode 32 and the N-type well 12 in the first region 10A to the total overlapping area of the floating gate electrode 32 and the semiconductor layer 10 in the first to third regions 10A to 10C is 6:10 to 9:10.

As shown in FIG. 1, the impurity regions as either a source region or a drain region are formed by using the floating gate electrode 32 as a mask. The P-type impurity regions 34 and 38 are respectively formed in the first region 10A and the third region 10C, and the N-type impurity regions 36 are formed in the second region 10B. The P-type impurity regions 34 and 38 are formed by providing a mask layer such as a resist layer to cover the second region 10B, and implanting P-type impurities using the floating gate electrode 32 as a mask. The N-type impurity regions 36 are formed by providing a mask layer such as a resist layer to cover the first and third regions 10A and 10C, and implanting N-type impurities using the floating gate electrode 32 as a mask.

An insulating layer, gate electrode, source region, and drain region of the select transistor (not shown) may be formed in the same step as the formation of the insulating layer 30, the formation of the floating gate electrode 32, or the formation of the impurity regions.

The nonvolatile memory device according to the first embodiment may be manufactured by the above-described steps. The method of manufacturing the nonvolatile memory device according to the second embodiment is described below indicating the difference from the above manufacturing method. The first region 10A, the second region 10B, and the third region 10C are partitioned by forming the isolation insulating layer. The N-type well 14 is formed in the third region 10C (see FIG. 4). If necessary, a P-type well (not shown) may be formed to enclose the first region 10A and the second region 10B. Then, the insulating layer 30 and the floating gate electrode 32 are formed. The P-type impurity regions 38 are formed in the third region 10C on each side of the floating gate electrode 32, and the N-type impurity regions 35 and 36 are respectively formed in the first region 10A and the second region 10B. The nonvolatile memory device of the second embodiment may be thus manufactured.

The nonvolatile memory device of this embodiment can be manufactured by the same steps as those of the CMOS transistor manufacturing process, as understood from the above-described manufacturing steps. Therefore, the nonvolatile memory device can be manufactured without using complicated steps, and can be embedded in a substrate (semiconductor layer) as that of an IC formed by MOS transistors.

The invention is not limited to the above-described embodiments. Various modifications and variations may be made within the scope of the invention. The shape as shown in FIGS. 1 and 4 is illustrated as the shape of the floating gate electrode 32. However, the shape of the floating gate electrode 32 is not limited thereto insofar as a desired capacitive coupling ratio can be secured. The nonvolatile memory device of the invention may be suitably used as a nonvolatile memory device for adjusting a liquid crystal panel, for example. When used as a nonvolatile memory device for adjusting a liquid crystal panel, since the nonvolatile memory device can be formed by the same steps as those of the CMOS transistor manufacturing process, the nonvolatile memory device can be formed at the same time as a liquid crystal display driver IC. As a result, a display driver IC provided with a nonvolatile memory device having excellent characteristics can be provided without increasing the number of manufacturing steps.

In the case of forming a memory cell array by using the nonvolatile memory device of this embodiment, the memory cell array may be formed in a mirror configuration taking the area efficiency into consideration.

Although only some embodiments of the invention have been described in detail above, those skilled in the art will readily appreciate that many modifications are possible in the embodiments without materially departing from the novel teachings and advantages of this invention. Accordingly, all such modifications are intended to be included within scope of this invention

What is claimed is:

1. A nonvolatile memory device, comprising:
a first semiconductor layer of a first conductivity type in which a first region, a second region, and a third region are partitioned by an isolation insulating layer;
a first semiconductor section of a second conductivity type provided in the first region and functioning as a control gate;
a second semiconductor section of the first conductivity type provided in the second region;
a third semiconductor section of the second conductivity type provided in the third region;
an insulating layer provided on the semiconductor layer in the first to third regions;
a floating gate electrode provided on the insulating layer across the first to third regions;
first impurity regions of the first conductivity type provided on each side of the floating gate electrode in the first region;
second impurity regions of the second conductivity type provided on each side of the floating gate electrode in the second region and functioning as either a source region or a drain region; and
third impurity regions of the first conductivity type provided on each side of the floating gate electrode in the third region and functioning as either a source region or a drain region,
wherein an overlapping area of the floating sate electrode and the first semiconductor section is greater than an overlapping area of the floating gate electrode and the second semiconductor section.

2. The nonvolatile memory device as defined in claim 1, wherein the first semiconductor section and the third semiconductor section are N-type wells.

3. A nonvolatile memory device, comprising:
a semiconductor layer of a first conductivity type in which a first region, a second region, and a third region are partitioned by an isolation insulating layer;
a first semiconductor section of a second conductivity type provided in the first region and functioning as a control gate;
a second semiconductor section of the first conductivity type provided in the second region;
a third semiconductor section of the second conductivity type provided in the third region;
an insulating layer provided on the semiconductor layer in the first to third regions;
a floating gate electrode provided on the insulating layer across the first to third regions;
first impurity regions of the first conductivity type provided on each side of the floating gate electrode in the first region;
second impurity regions of the second conductivity type provided on each side of the floating gate electrode in the second region and functioning as either a source region or a drain region; and
third impurity regions of the first conductivity type provided on each side of the floating gate electrode in the third region and functioning as either a source region or a drain region,
wherein a ratio of a total overlapping area of the floating gate electrode and the semiconductor layer in the first to third regions to an overlapping area of the first semiconductor section and the floating gate electrode in the first region is 10:6 to 10:9.

4. A nonvolatile memory device, comprising:
a semiconductor layer of a first conductivity type in which a first region, a second region and a third region are partitioned by an isolation insulating layer;
an insulating layer provided on the semiconductor layer;
a floating gate electrode provided on the insulating layer;

the insulating layer and the floating gate electrode provided across the first to third regions, wherein in the first region, a first semiconductor section of a second conductivity type and first impurity regions of the first conductivity type are provided, the first semiconductor section of the second conductivity type provided in the semiconductor layer and functioning as a control gate, and the first impurity regions of the first conductivity type provided on each side of the floating gate electrode, in the second region, a second semiconductor section of the first conductivity type and second impurity regions of the second conductivity type are provided, the second semiconductor section of the first conductivity type provided in the semiconductor layer, and the second impurity regions of the second conductivity type functioning as either a source region or a drain region and provided on each side of the floating gate electrode, in the third region, a third semiconductor section of the second conductivity type and third impurity regions of the first conductivity type are provided, the third semiconductor section of the second conductivity type provided in the semiconductor layer, and the third impurity regions of the first conductivity type provided on each side of the floating gate electrode and functioning as either a source region or a drain region, and wherein an overlapping area of the floating gate electrode and the first semiconductor section is greater than an overlapping area of the floating gate electrode and the semiconductor layer in the second region.

5. The nonvolatile memory device as defined in claim 4, wherein the first and third semiconductor sections are N-type wells.

6. The nonvolatile memory device as defined in claim 4, wherein the semiconductor layer is a semiconductor substrate, and the first, second and third semiconductor sections are parts of the semiconductor substrate in which impurities are implanted.

7. A nonvolatile memory device, comprising:

a semiconductor layer of a first conductivity type in which a first region, a second region and a third region are partitioned by an isolation insulating layer;

an insulating layer provided on the semiconductor layer;

a floating gate electrode provided on the insulating layer;

the insulating layer and the floating gate electrode provided across the first to third regions, wherein in the first region, a first semiconductor section of a second conductivity type and first impurity regions of the first conductivity type are provided, the first semiconductor section of the second conductivity type provided in the semiconductor layer and functioning as a control gate, and the first impurity regions of the first conductivity type provided on each side of the floating gate electrode, in the second region, a second semiconductor section of the first conductivity type and second impurity regions of the second conductivity type are provided, the second semiconductor section of the first conductivity type provided in the semiconductor layer, and the second impurity regions of the second conductivity type provided on each side of the floating gate electrode and functioning as either a source region or a drain region, in the third region, a third semiconductor section of the second conductivity type and third impurity regions of the first conductivity type are provided, the third semiconductor section of the second conductivity type provided in the semiconductor layer, and the third impurity regions of the first conductivity type provided on each side of the floating gate electrode and functioning as either a source region or a drain region, and wherein a ratio of a total overlapping area of the floating gate electrode and the semiconductor layer in the first, second and third regions to an overlapping area of the first semiconductor section and the floating gate electrode is 10:6 to 10:9.

8. The nonvolatile memory device as defined in claim 7, wherein the semiconductor layer is a semiconductor substrate, and the first, second and third semiconductor sections are parts of the semiconductor substrate in which impurities are implanted.

* * * * *